United States Patent
Cheng et al.

(10) Patent No.: US 6,531,382 B1
(45) Date of Patent: Mar. 11, 2003

(54) USE OF A CAPPING LAYER TO REDUCE PARTICLE EVOLUTION DURING SPUTTER PRE-CLEAN PROCEDURES

(75) Inventors: Tao Cheng, Kangshang (TW); Wen-Hsin Huang, Hsin-Chu (TW); Jiun-Pyng You, Hsin-Chu (TW); Lin-June Wu, Hsin-Chu (TW); Shih-Tzung Chang, Fengyuan (TW); Ming-Jei Lee, Hsin-Chu (TW); Chun-Chang Chen, Dali (TW); Yu-Ku Lin, Hsin-Chu (TW); Tong-Hua Kuan, Hsinchu (TW); Ying-Lang Wang, Tai-Chung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/140,662

(22) Filed: May 8, 2002

(51) Int. Cl.$^7$ .................. H01L 21/3205; H01L 21/31
(52) U.S. Cl. ........................ 438/597; 438/778
(58) Field of Search ............................. 438/597, 778

(56) References Cited

U.S. PATENT DOCUMENTS

| 6,042,999 A | 3/2000 | Lin et al. ............ 430/316 |
| 6,129,819 A | 10/2000 | Shan et al. ............ 204/192.3 |
| 6,133,144 A | 10/2000 | Tsai et al. ............ 438/634 |
| 6,136,680 A | 10/2000 | Lai et al. ............ 438/597 |
| 6,326,301 B1 * | 12/2001 | Venkatesan et al. |
| 2002/0072250 A1 * | 6/2002 | Jeong et al. |

FOREIGN PATENT DOCUMENTS

JP          2000236021       * 8/2000

* cited by examiner

Primary Examiner—John F. Niebling
Assistant Examiner—Stanetta Isaac
(74) Attorney, Agent, or Firm—George O. Saile; Stephen B. Ackerman

(57) ABSTRACT

A process for preparing a surface of a lower level metal structure, exposed at the bottom of a sub-micron diameter opening, to allow a low resistance interface to be obtained when overlaid with an upper level metal structure, has been developed. A disposable, capping insulator layer is first deposited on the composite insulator layer in which the sub-micron diameter opening will be defined in, to protect underlying components of the composite insulator from a subsequent metal pre-metal procedure. After anisotropically defining the sub-micron diameter opening in the capping insulator, and composite insulator layers, and after removal of the defining photoresist shape, an argon sputtering procedure is used to remove native oxide from the surface of the lower level metal structure. In addition to native oxide removal the argon sputtering procedure, featuring a negative DC bias applied to the substrate, also removes the capping insulator layer from the top surface of the composite insulator layer. An in situ metal deposition then allows a clean interface to result between the overlying metal layer, and the underlying plasma treated, metal surface.

22 Claims, 2 Drawing Sheets

USE OF A CAPPING LAYER TO REDUCE PARTICLE EVOLUTION DURING SPUTTER PRE-CLEAN PROCEDURES

BACKGROUND OF THE INVENTION (1) Field of the Invention

The present invention relates to methods used to fabricate semiconductor devices and more specifically to a method used to pre-clean a surface prior to metal deposition.

(2) Description of Prior Art

The use of micro-miniaturization, or the ability to fabricate semiconductor devices with sub-micron features, has allowed the performance of the sub-micron semiconductor device to be increased, while the fabrication cost for semiconductor chips comprised with sub-micron semiconductor devices, has decreased. The use of sub-micron features have allowed performance degrading, parasitic capacitances to be reduced, in addition to allowing a greater number of smaller semiconductor chips to be obtained from a specific size starting substrate, thus reducing the fabrication cost for a specific semiconductor chip. The smaller semiconductor chips, comprised with sub-micron features, still provide device densities equal to, or greater than, counterpart semiconductor chips, comprised with larger features.

One example of the use of sub-micron features is formation of sub-micron contact holes, or openings, in specific dielectric layers, to expose a portion of an underlying metal structure. The use of micro-miniaturization have allowed contact holes, or via openings, with diameters less then 0.25 um, to routinely be formed. However the small contact area now presented by the sub-micron opening demands a clean, or oxide free metal surface to be exposed at the bottom of the sub-micron via opening to minimize resistance at this interface when overlaid with a subsequent, overlying metal plug structure. However several processes performed prior to metal deposition, can result in unwanted material residing on the exposed metal surface. The removal of the photoresist shape used to define the sub-micron contact hole, or via opening, results in the formation of a native oxide layer on the metal structure, exposed at the bottom of the sub-micron opening. In addition the insulator layer in which the sub-micron opening was defined in, when subjected to the plasma pre-clean procedure, used to remove native oxide from the exposed metal surface, can flake or be disturbed, re-depositing on metal surface as well as interfering with the native oxide removal procedure.

This invention will teach a procedure in which a metal pre-clean can be performed via argon sputtering, resulting in removal of native oxide from the surface of the metal structure exposed at the bottom of the sub-micron opening in a composite insulator layer, in addition to avoiding flaking or particle generation of components of the composite insulator layer exposed during the pre-clean procedure. This is accomplished via use of a disposable capping insulator layer, used to protect the composite insulator layers in which the sub-micron opening is defined in, from thinning, as well as from flaking or contaminating the exposed metal surface, during the metal pre-clean procedure. Prior art, such as Lai et al, in U.S. Pat. No. 6,136,680, describe a procedure for preparing a metal surface for acceptance of an overlying metal layer, however that prior art does not describe the novel, disposable capping insulator layer, used in the present invention, which allows preparation of a metal surface, exposed in a sub-micron opening, to be successfully performed.

SUMMARY OF THE INVENTION

It is an object of this invention to define an opening with a sub-micron diameter, in a composite insulator layer, to expose a portion of a top surface of a metal structure.

It is another object of this invention to employ a capping insulator layer, as a top layer of the composite insulator layer, to protect underlying components of the composite insulator layer from a metal pre-clean procedure performed in a plasma.

It is still another object of this invention to consume the capping insulator layer during the plasma metal pre-clean procedure.

In accordance with the present invention a method of plasma cleaning a metal structure, located at the bottom of a sub-micron diameter opening in an composite insulator layer, and featuring overlying, disposable capping insulator layer as a component of the composite insulator layer, is described. After creation of an underlying metal structure a composite insulator layer comprised of: a thin, underlying, silicon rich oxide (SRO), layer; a fluorinated silica glass (FSG), layer; a plasma enhanced oxide (PE-OX), layer; a silicon oxynitride, bottom anti-reflective coating, (BARC); and a thin, overlying, disposable capping oxide layer; is deposited. A photoresist shape is used as a mask to allow a sub-micron diameter opening to be defined in the composite insulator layer, exposing a portion of the top surface of the metal structure. After removal of the defining photoresist shape, an argon sputtering procedure is performed in a metal pre-clean chamber, removing native oxide from the top surface of the exposed metal structure, in addition to removing the capping insulator layer, which protected the underlying SiON BARC component of the composite insulator layer from the argon sputtering procedure, preventing SiON flaking and particles from contaminating the exposed surface of the plasma cleaned, metal structure. In situ deposition of a metal layer, is then accomplished filling the sub-micron diameter opening, resulting in an oxide free, and particle free interface between the filling metal layer and the top surface of the underlying plasma cleaned, metal structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
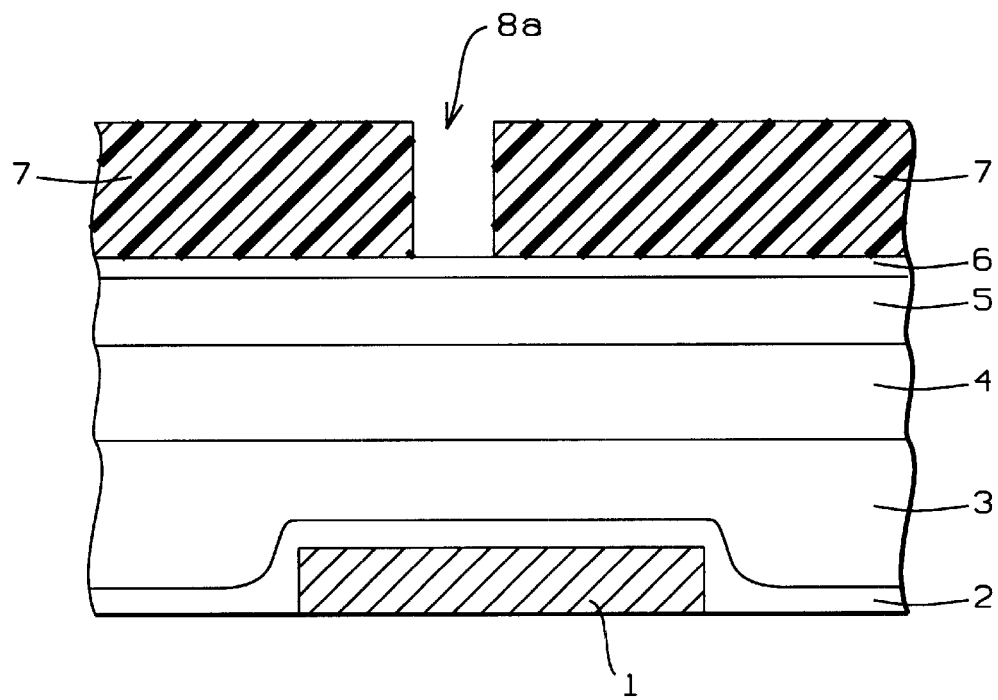
FIGS. 1–4, which schematically, in cross-sectional style, describe key stages of fabrication used to plasma clean a metal structure located at the bottom of a sub-micron diameter, contact hole opening, wherein the sub-micron opening is defined in a composite insulator layer, which in turn is comprised with an overlying, disposable capping insulator layer, used to prevent flaking of, and to protect, other components of the composite insulator layer during the plasma, metal pre-clean procedure.

The method for forming a sub-micron diameter opening in a composite insulator layer, and for preparing a metal surface, located at the bottom of the sub-micron diameter opening, prior to filling with a metal structure, will now be described in detail. A metal structure 1, comprised of a metal such as aluminum, aluminum—copper, copper, tungsten, or a metal silicide, is defined and schematically shown in FIG. 1. Insulator layer 2, comprised of a silicon rich oxide (SRO), layer, at a thickness between about 200 to 400 Angstroms, is deposited via plasma enhanced chemical vapor deposition (PECVD), procedures. To improve semiconductor device performance, a low dielectric constant (low k), layer 3, such as a fluorinated silica glass (FSG), layer, is deposited via chemical vapor deposition (CVD) procedures, to a thickness between about 5000 to 6000 Angstroms. FSG layer 3, with a dielectric constant between about 3.0 to 4.0, will present lower capacitance, and thus increased performance, when compared to counterpart insulator layers comprised with higher dielectric constant values. Silicon oxide layer 4, is then deposited again via PECVD procedures, to a thickness between about 1500 to 2500 Angstroms, followed by deposition of silicon oxynitride (SiON), layer 5, at a thickness between about 500 to 700 Angstroms, via CVD procedures. Silicon oxynitride layer 5, will serve as a bottom anti-reflective coating (BARC), layer, allowing increased acuity of a sub-micron feature, to be exposed and developed in an overlying photoresist shape, to be realized. The result of these depositions are schematically shown in FIG. 1.

If a sub-micron diameter opening were now formed in the composite insulator comprised of silicon oxynitride layer 5, silicon oxide layer 4, FSG layer 3, and SRO layer 2, via photolithographic and anisotropic, reactive ion etching (RIE), procedures, the removal of the defining photoresist shape would be accomplished using plasma oxygen ashing. The ashing procedure however results in the growth of native oxide on the portion of metal structure 1, exposed in the sub-micron diameter opening. The presence of the native oxide becomes more critical as the diameter of the opening decreases, due to the potential of increased interface resistance resulting from a decreased contact area available for an overlying metal plug structure. Therefore after ashing of the photoresist shape, and prior to metal deposition used to fill the sub-micron diameter opening, an in situ pre-clean procedure, such as an argon sputtering procedure, is used. However in addition to the positive result of removing native oxide from the surface of metal structure 1, the argon sputtering procedure can attack the exposed surfaces of silicon oxynitride layer 5, resulting in flaking or creation of silicon oxynitride particles, landing on the prepared surface of metal structure 1, thus negatively influencing the ability to minimize interface resistance. In addition the generation of silicon oxynitride particles can result in contamination of the pre-clean chamber, perhaps resulting in unwanted contamination and yield loss for products next used in the contaminated pre-clean tool. Therefore to protect the needed BARC or silicon oxynitride layer 5, from the argon sputter, pre-clean procedure, capping layer 6, comprised of a PECVD silicon oxide layer, is deposited at a thickness between about 200 to 300 Angstroms. The thickness of capping layer 6, shown schematically in FIG. 1, is chosen so that consumption of this layer can result from exposure to the argon sputtering, pre-clean procedure. Photoresist shape 7, with opening 8a, comprised with a diameter between about 0.21 to 0.27 um, is next formed, exposing a portion of the top surface of capping layer 6. This is schematically shown in FIG. 1.

Figure 2:
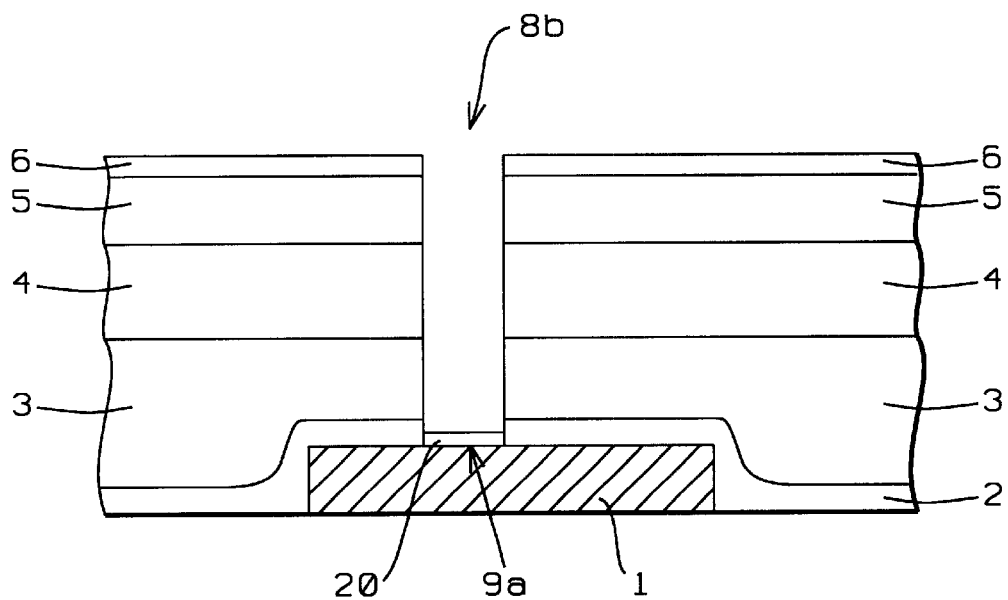

An anisotropic RIE procedure, using $CHF_3$ or $CF_4$ as an etchant for capping layer 6, for silicon oxynitride layer 5, for silicon oxide layer 4, for FSG layer 3, and for SRO layer 2, is used to transfer opening 8a, in photoresist shape 7, to the composite insulator layer, in terms of sub-micron diameter opening 8b, featuring a diameter between about 0.19 to 0.25 um, exposing a portion of the top surface of metal structure 1. Removal of photoresist shape 7, via plasma oxygen ashing procedure, however results in native oxide layer 20, now residing at surface 9a, of metal structure 1. This is schematically shown in FIG. 2.

Figure 3:
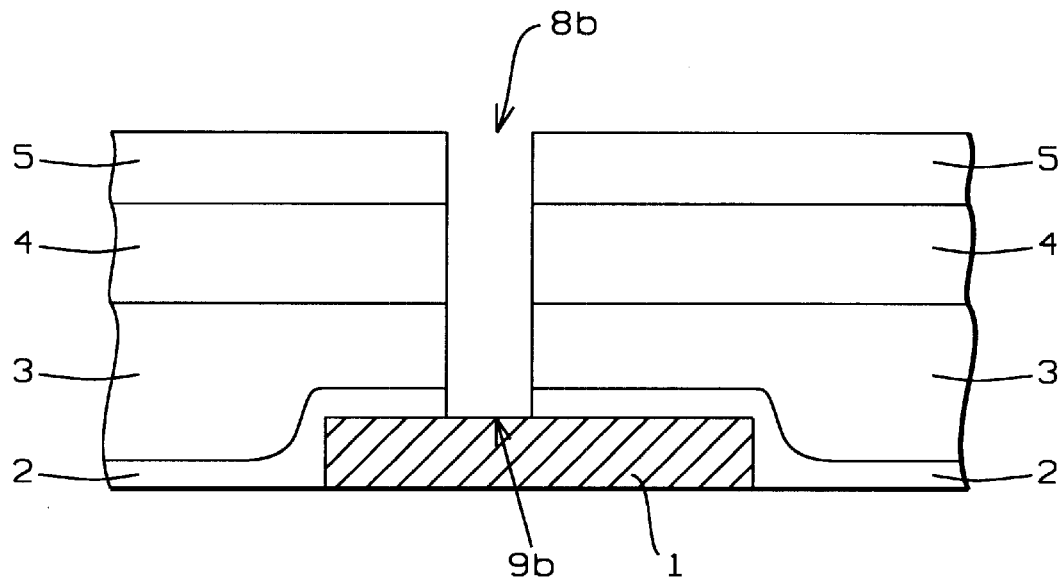

A critical pre-clean procedure, accomplished via an argon sputtering procedure, is next performed in situ, with a subsequent metal deposition, either in the same chamber to be used for the metal deposition, or in another chamber, however in the same tool to be used for metal deposition, thus avoiding exposure to the environment after the pre-clean procedure. The metal pre-clean procedure is performed in an argon plasma, at a power between about 200 to 400 watts, at a pressure between about 0.5 to 1.5 mtorr, and with a negative DC bias applied to metal structure 1. The bias applied, between about −200 to −300 volts, allows the positively charged argon ions to be accelerated to the surface of the negatively biased metal structure 1, removing via collisions of accelerated argon ions, native oxide layer 20, resulting in oxide free, metal surface 9b, shown schematically in FIG. 3. In addition the capping layer 6, used to protect silicon oxynitride layer 5, during the argon sputtering, pre-clean procedure, is slowly consumed during this same argon sputtering, pre-clean procedure, resulting in an absence of capping layer 6, at the conclusion of the pre-clean procedure. Thus the thickness chosen for capping layer 6, allowed protection of underlying components of the composite insulator layer to be realized, while the ultimate consumption of this layer, experienced at the conclusion of the pre-clean procedure, allowed the capacitance of the composite insulator layer to be reduced.

Figure 4:
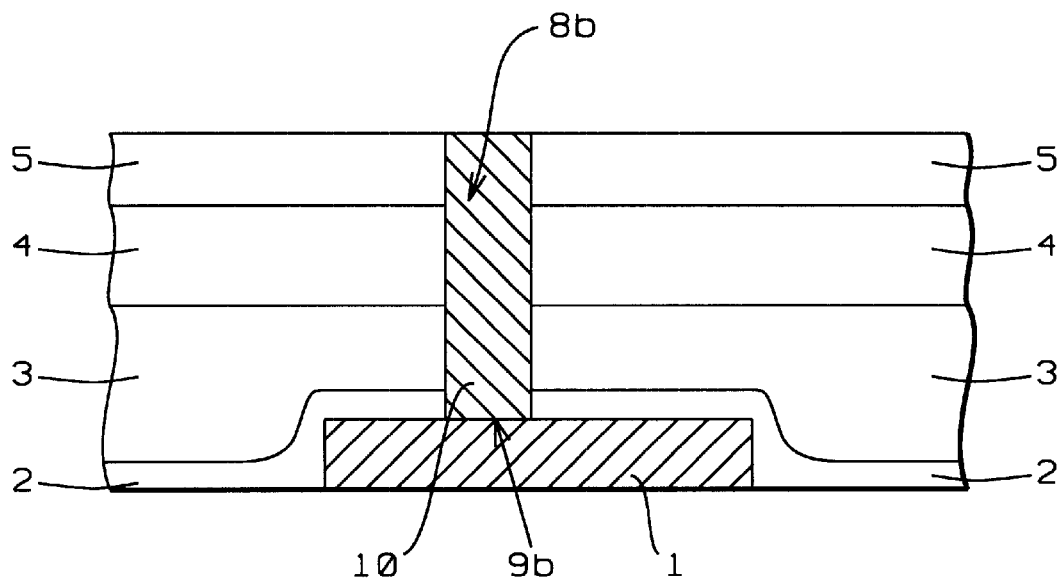

The deposition of a metal layer is next performed either in situ, in the same chamber just used for the argon sputter, pre-clean procedure, or in another chamber, but still in the same tool, thus avoiding exposure oxide free metal surface 9b, to the environment. A metal layer chosen from a group that includes aluminum, aluminum—copper, copper, tungsten, or a metal silicide, is obtained via plasma vapor deposition, or via chemical vapor deposition procedures, at a thickness between about 3000 to 5000 Angstroms, completely filling sub-micron diameter opening 8b. Removal of unwanted portions of the metal layer from the top surface of silicon oxynitride layer 5, is accomplished via chemical mechanical polishing procedures, or via a selective RIE procedure, using $Cl_2$ as an etchant for the metal layer. The result of these procedures, metal deposition and removal, result in the definition of metal plug structure 10, in sub-micron diameter opening 8b. This is schematically shown in FIG. 4. The interface resistance between metal plug structure 10, and metal structure 1, is minimized as a result of the pre-clean procedure used to remove native oxide from the surface of metal structure 1, exposed in sub-micron diameter opening 8b. If desired instead of forming metal plug structure 10, an upper level metal structure can be defined, comprised of an underlying metal plug component, located in sub-micron diameter opening 8b, and an overlying metal shape component. This configuration can be realized via the same metal deposition procedure, however using conventional photolithographic and RIE procedures to define the metal shape component of the upper level metal structure. In addition, if desired a titanium—titanium nitride composite layer can be deposited prior to the metal deposition, with the titanium component serving as an adhesion layer, while the titanium nitride layers provides barrier characteristics. This composite layer would be deposited via plasma vapor deposition procedures, in situ after the argon sputtering pre-clean procedure.

While this invention has been particularly shown and described with reference to, the preferred embodiments thereof, it will be understood by those skilled in the art that various changes in form and details may be made without departing from the spirit and scope of this invention.

What is claimed is:

1. A method of forming a contact hole opening, defined in a stack of insulator layers, and for preparing a surface of a lower level metal structure, exposed at the bottom of said contact hole opening, for a subsequent occupying upper level metal structure, comprising the steps of:

providing said lower level metal structure;

depositing a composite insulator layer;

forming a bottom anti-reflective coating (BARC), layer on said composite insulator layer;

depositing a disposable insulator layer on said BARC layer;

forming said contact hole opening in said disposable insulator layer, in said BARC layer, and in said composite insulator layer, exposing a portion of the top surface of said lower level metal structure;

performing a sputter clean procedure to clean said portion of the top surface of said lower level metal structure, exposed in said contact hole opening, and to remove said disposable insulator layer; and forming said upper level metal structure in said contact hole opening, wherein a metal layer used for definition of said upper level metal structure is deposited in situ, in same tool used to perform said sputter clean procedure.

2. The method of claim 1, wherein said lower level metal structure is comprised of a conductive material chosen from a group that includes aluminum, aluminum—copper, copper, tungsten, or a metal silicide layer.

3. The method of claim 1, wherein an underlying component of said composite insulator layer is a silicon rich oxide (SRO), layer, obtained via plasma enhanced chemical vapor deposition (PECVD), procedures, at a thickness between about 200 to 400 Angstroms.

4. The method of claim 1, wherein a fluorinated silica glass (FSG), layer, is formed on the underlying component of said composite insulator layer, via chemical vapor deposition (CVD) procedures, at a thickness between about 5000 to 6000 Angstroms, with the FSG layer comprised with a dielectric constant between about 3.0 to 4.0.

5. The method of claim 1, wherein an overlying component of said composite insulator layer, deposited on the FSG component of said composite insulator layer, is a silicon oxide layer, obtained via PECVD procedures, at a thickness between about 1500 to 2500 Angstroms.

6. The method of claim 1, wherein said BARC layer is a silicon oxynitride layer, obtained via CVD procedures at a thickness between about 500 to 700 Angstroms.

7. The method of claim 1, wherein said disposable insulator layer is a silicon oxide layer, obtained via PECVD procedures, at a thickness between about 200 to 300 Angstroms.

8. The method of claim 1, wherein said contact hole opening is formed via anisotropic reactive ion etching procedures, using $CHF_3$ or $CF_4$ as an etchant for said disposable insulator layer, for said BARC layer, and for said composite insulator layer.

9. The method of claim 1, wherein the diameter of said contact hole opening is between about 0.19 to 0.25 um.

10. The method of claim 1, wherein said sputter clean procedure is performed in an plasma, at a power between about 200 to 400 watts, at a pressure between about 0.5 to 1.5 mtorr, with a DC bias of between −200 to −300 volts applied to said lower level metal structure.

11. The method of claim 1, wherein said upper level metal structure is comprised of a conductive material chosen from a group that includes aluminum, aluminum—copper, copper, tungsten, or a metal silicide layer.

12. A method of forming a sub-micron diameter opening in a stack of insulator layers to expose a surface of a lower level metal structure, and to clean the surface of said lower level metal structure via a sputter pre-clean procedure, and with said plasma pre-clean procedure resulting in removal of a capping insulator layer, used as an overlying component of said stack of insulator layers, comprising the steps of:

providing said lower level metal structure;

depositing a silicon rich oxide layer;

depositing a low dielectric constant, (low k), layer;

depositing a silicon oxide layer;

forming a bottom anti-reflective coating (BARC), layer;

depositing said capping insulator layer;

forming a photoresist shape comprised with a sub-micron feature exposing a portion of the top surface of said capping insulator layer;

performing an anisotropic reactive ion etching (RIE), procedure, and using said photoresist shape as an etch mask, to define said sub-micron diameter opening in said capping insulator layer, in said BARC layer, in said silicon oxide layer, in said low k layer, and in said silicon rich oxide layer, resulting in exposure of a portion of the top surface of said lower level metal structure;

removing said photoresist shape resulting in formation of a native oxide layer on exposed portion of said lower level metal structure;

performing said sputter pre-clean procedure to remove said native oxide layer, and to remove said capping insulator layer; and forming an upper level metal structure in said sub-micron diameter opening, overlying and contacting the sputter cleaned surface of said lower level metal structure, wherein a metal layer used for definition of said upper level metal structure is deposited in-situ in same tool used for said sputter pre-clean procedure.

13. The method of claim 12, wherein said lower level metal structure is comprised of a conductive material chosen from a group that includes aluminum, aluminum—copper, copper, tungsten, or a metal silicide layer.

14. The method of claim 12, wherein said silicon rich oxide (SRO), layer is obtained via plasma enhanced chemical vapor deposition (PECVD), procedures, at a thickness between about 200 to 400 Angstroms.

15. The method of claim 12, wherein said low k layer is a fluorinated silica glass (FSG), layer, formed via chemical vapor deposition (CVD) procedures, at a thickness between about 5000 to 6000 Angstroms, with a dielectric constant between about 3.0 to 4.0.

16. The method of claim 12, wherein said silicon oxide layer is obtained via PECVD procedure, at a thickness between about 1500 to 2500 Angstroms.

17. The method of claim 12, wherein said BARC layer is a silicon oxynitride layer, obtained via CVD procedures at a thickness between about 500 to 700 Angstroms.

18. The method of claim 12, wherein said capping insulator layer is a silicon oxide layer, obtained via PECVD procedures, at a thickness between about 200 to 300 Angstroms.

19. The method of claim 12, wherein said via anisotropic reactive ion etching procedure, used to define said sub-micron diameter opening, is performed using $CHF_3$ or $CF_4$ as an etchant for said capping insulator layer, for said BARC layer, for said silicon oxide layer, for said low k layer, and for said silicon rich oxide layer.

20. The method of claim 12, wherein the diameter of said sub-micron diameter opening is between about 0.19 to 0.25 um.

21. The method of claim 12, wherein said sputter clean procedure is performed in an argon plasma, at a power between about 200 to 400 watts, at a pressure between about 0.5 to 1.5 mtorr, and with a DC bias of between −200 to −300 volts applied to said lower level metal structure.

22. The method of claim 12, wherein said upper level metal structure is comprised of a conductive material chosen from a group that includes aluminum, aluminum—copper, copper, tungsten, or a metal silicide layer.

* * * * *

UNITED STATES PATENT AND TRADEMARK OFFICE
CERTIFICATE OF CORRECTION

PATENT NO. : 6,531,382 B1
DATED : March 11, 2003
INVENTOR(S) : Toa Cheng et al.

It is certified that error appears in the above-identified patent and that said Letters Patent is hereby corrected as shown below:

<u>Title page,</u>
Item [75], Inventors, please delete "Ming-Jei Lee" and replace it with
-- Ming-Jer Lee --.

Signed and Sealed this

Fifteenth Day of November, 2005

JON W. DUDAS
*Director of the United States Patent and Trademark Office*